(12) United States Patent
Tai

(10) Patent No.: US 10,135,397 B2
(45) Date of Patent: Nov. 20, 2018

(54) BOOST CIRCUIT FOR USE IN POWER AMPLIFIER

(71) Applicant: RichWave Technology Corp., Taipei (TW)

(72) Inventor: Shun-Nan Tai, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 15/655,810

(22) Filed: Jul. 20, 2017

(65) Prior Publication Data

US 2018/0152146 A1    May 31, 2018

(30) Foreign Application Priority Data

Nov. 28, 2016   (TW) .............................. 105139018 A (51) Int. Cl.
*H03G 3/30* (2006.01)
*H03F 1/02* (2006.01)
*H03F 3/21* (2006.01)
*H03F 3/343* (2006.01)

(52) U.S. Cl.
CPC ............. *H03F 1/0227* (2013.01); *H03F 3/21* (2013.01); *H03F 3/3435* (2013.01)

(58) Field of Classification Search
CPC .................................... H03F 3/04; H03F 3/21
USPC .................................................. 330/285, 296
See application file for complete search history.

(56) References Cited

U.S. PATENT DOCUMENTS 9,667,203 B2 *   5/2017   Li ............................. H03F 3/21

* cited by examiner

*Primary Examiner* — Steven J Mottola
(74) *Attorney, Agent, or Firm* — Winston Hsu (57) ABSTRACT

A boost circuit for use in a power amplifier includes a voltage-to-voltage generator, a voltage-to-current converter, and a differential current generator. The voltage-to-voltage generator is configured to generate a converting voltage according to a reference voltage, wherein the absolute value of the slope at the rising edge of the converting voltage is smaller than the absolute value of the slope at the rising edge of the reference voltage. The voltage-to-current converter is configured to generate first current according to the converting voltage, wherein the waveform of the first current corresponds to the waveform of the converting voltage. The differential current generator is configured to generator second current associated with the waveform of the reference voltage, thereby outputting operational current whose value is associated with the first current and the second current.

20 Claims, 7 Drawing Sheets

BOOST CIRCUIT FOR USE IN POWER AMPLIFIER

CROSS REFERENCE TO RELATED APPLICATION

This application claims priority of Taiwan application No. 105139018, which was filed on Nov. 28, 2016, and is included herein by reference.

TECHNICAL FIELD

The present invention is related to a boost circuit for use in a power amplifier, and more particularly, to a boost circuit capable of shortening transient response for use in a power amplifier.

BACKGROUND

Amplifiers are commonly used in electronic equipment in order to amplify device characteristics, such as gain, bandwidth and linearity. Amplifiers are widely used in active filters, buffers, analog-to-digital converters, and radio frequency (RF) transceivers. In wireless communication applications, power amplifiers, as an essential part in RF circuits, are normally disposed at the front end of an antenna transceiver. The main function of a power amplifier is to enlarge output signals, and is the most power-consuming part in the RF front-end circuit.

A biasing circuit is usually used for supplying bias current or bias voltage to a power amplifier, so that the power amplifier may operate in a linear region for amplifying signals. The biasing circuit includes a main bias block and a gain-correction block. The main bias block is configured to generate bias current. The gain-correction block is configured to generate correction current for adjusting the value of the bias current, thereby compensating gain variations as the power amplifier switches from a disabled state to an enabled state. For example, when the power amplifier is just activated, it remains to operate in a transient state due to temperature effect for a period of time before being able to operate in a stable state. Since the gain in the transient state is lower than the gain in the stable state effect, the gain-correction block can provide the correction current at initial activation of the power amplifier so as to compensate the smaller gain in the transient state. However, the prior art biasing circuit usually provides the correction current using current mirrors which consume a lot of power. Therefore, there is a need for a boost circuit capable of shortening transient response for use in a power amplifier while minimizing the use of current mirrors.

SUMMARY

An embodiment of the present invention provides a boost circuit for use in a power amplifier. The boost circuit includes an input end arranged to output a reference voltage, a first output end arranged to output operational current, a reference end coupled to a reference level, a voltage-to-voltage generator, a voltage-to-current generator, and a differential current generator. The voltage-to-voltage generator is coupled to the input end and configured to generate a converting voltage according to the reference voltage, wherein an absolute value of a rising edge slope on a waveform of the converting voltage is smaller than an absolute value of a rising edge slope on a waveform of the reference voltage, or an absolute value of a falling edge slope on the waveform of the converting voltage is smaller than an absolute value of a falling edge slope on the waveform of the reference voltage. The voltage-to-current generator is coupled to the voltage-to-voltage generator and configured to convert the converting voltage into first current, wherein a waveform of the first current corresponds to a waveform of the converting voltage. The differential current generator is coupled between the input end and the voltage-to-current generator and configured to generate second current associated the waveform the reference voltage and output the operational current, wherein the operational current is associated with the first current and the second current.

Another embodiment of the present invention provides a boost circuit for use in a power amplifier. The boost circuit includes an input end arranged to output a reference voltage, a first output end arranged to output operational current, a reference end coupled to a reference level, a voltage-to-voltage generator, a voltage-to-current generator, and a differential current generator. The reference voltage changes from a first voltage to a second voltage during a period and remains at the second voltage for a predetermined period of time. The voltage-to-voltage generator is coupled to the input end and configured to generate a converting voltage according to the reference voltage, wherein a value of the converting voltage gradually approaches a value of the second voltage during the predetermined period of time. The voltage-to-current generator is coupled to the voltage-to-voltage generator and configured to convert the converting voltage into first current, wherein a waveform of the first current corresponds to a waveform of the converting voltage. The differential current generator is coupled between the input end and the voltage-to-current generator and configured to generate second current associated the waveform the reference voltage and output the operational current, wherein the operational current is associated with the first current and the second current.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 1:
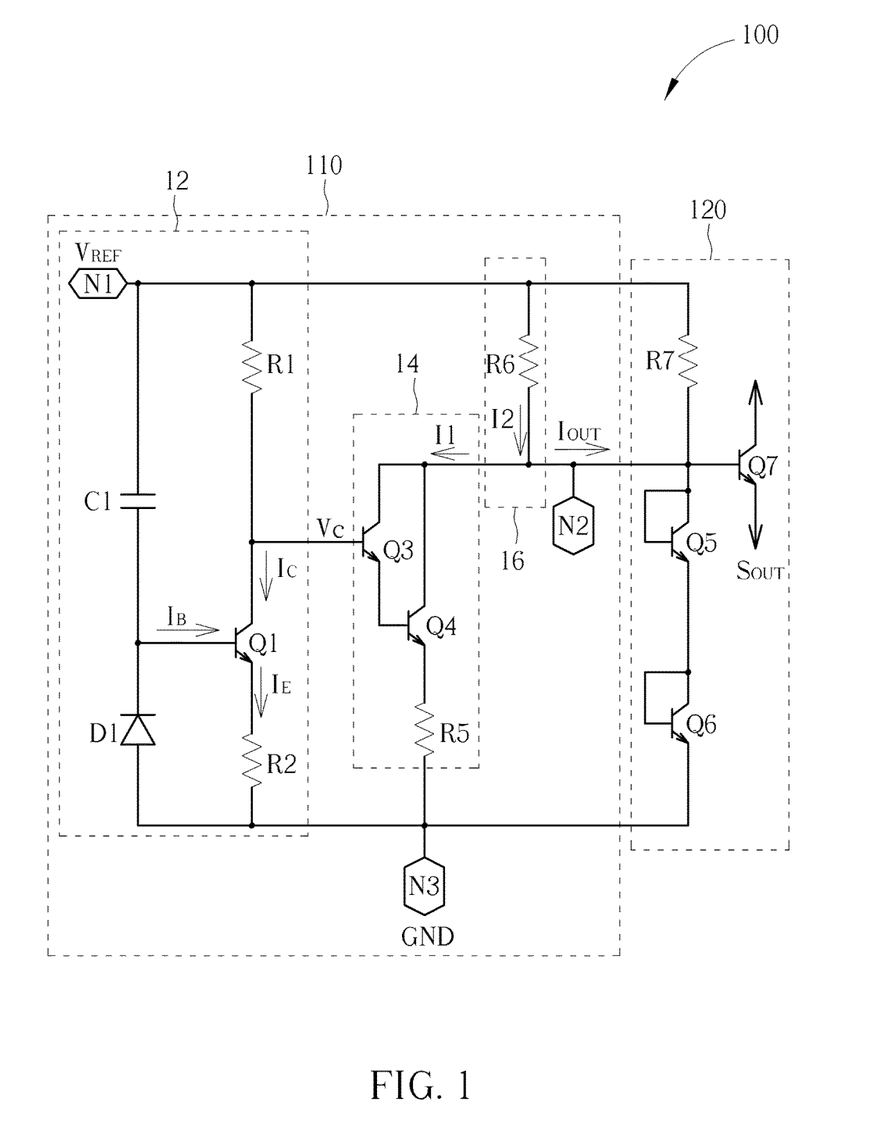
FIG. 1 is a diagram illustrating a biasing circuit for use in a power amplifier.

FIG. 1 is a diagram illustrating a biasing circuit 100 for use in a power amplifier. The biasing circuit 100 includes a boost circuit 110 and a converting circuit 120. The boost circuit 110 includes an input end N1, an output end N2, a reference end N3, a voltage-to-voltage generator 12, a voltage-to-current generator 14, and a differential current generator 16. The input end N1 is coupled to a reference voltage $V_{REF}$. The output end N2 is arranged to output operational current $I_{OUT}$. The reference end N3 is coupled to a reference level GND.

The voltage-to-voltage generator 12, coupled to the input end N1 and the reference end N3, is configured to generate a converting voltage $V_C$ according to the reference voltage $V_{REF}$, wherein the absolute value of the rising edge slope on the waveform of the converting voltage $V_C$ is smaller than the absolute value of the rising edge slope on the waveform of the reference voltage $V_{REF}$ when the reference voltage $V_{REF}$ is increasing, or the absolute value of the falling edge slope on the waveform of the converting voltage $V_C$ is smaller than the absolute value of the falling edge slope on the waveform of the reference voltage $V_{REF}$ when the reference voltage $V_{REF}$ is decreasing. In other words, the voltage-to-voltage generator 12 functions as a slow ramp generator. For illustrative purpose, the following example addresses the situation when the reference voltage $V_{REF}$ is increasing.

Figure 2:
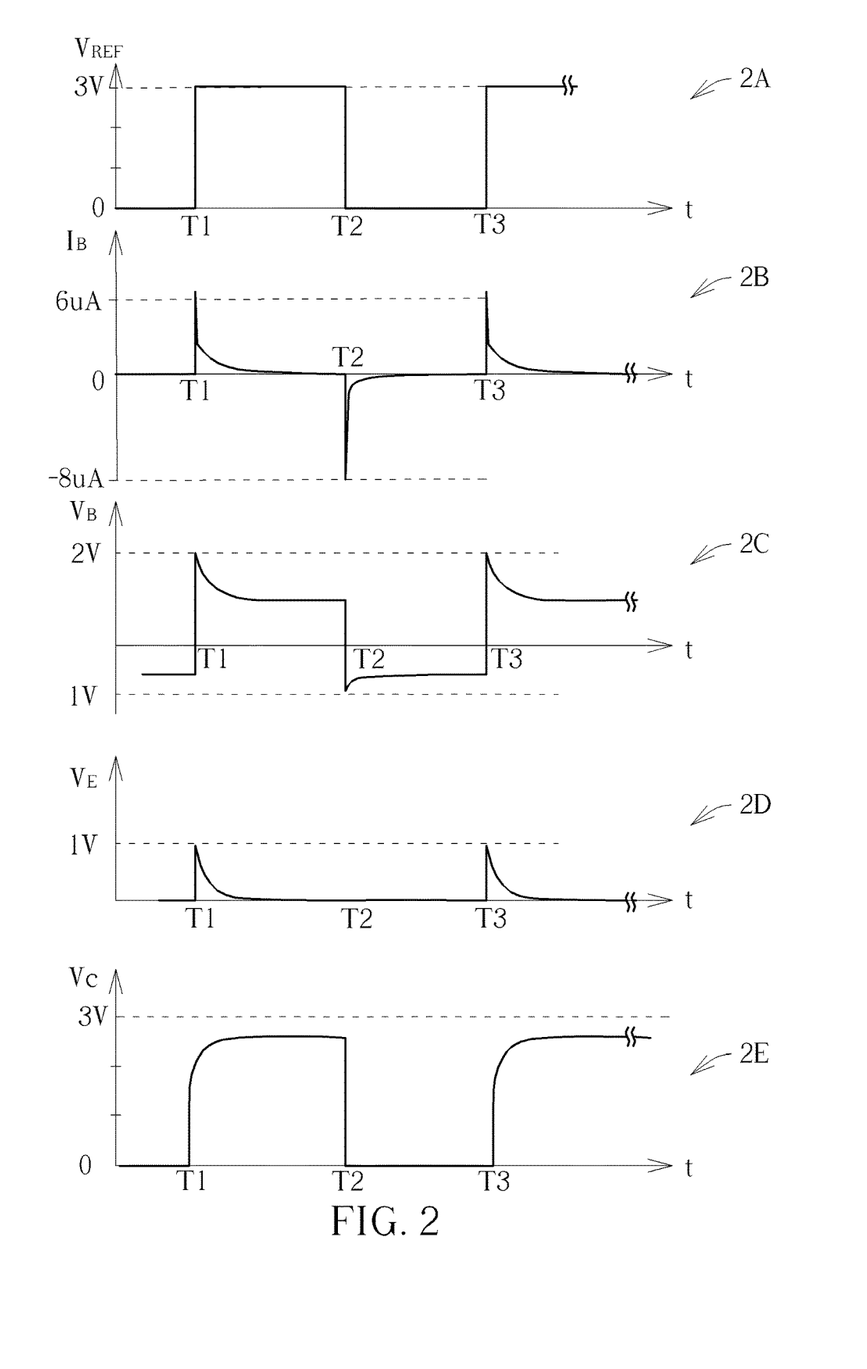
FIG. 2 is a diagram illustrating relevant operational voltages and current of a voltage-to-voltage generator according to embodiments of the present invention.

In another embodiment, the reference voltage $V_{REF}$ changes from a first voltage to a second voltage during a period and remains at the second voltage for a predetermined period of time. The voltage-to-voltage generator 12 may be configured to generate the converting voltage $V_C$ according to the reference voltage $V_{REF}$ so that the value of the converting voltage $V_C$ gradually approaches the value of the second voltage within the predetermined period. In the embodiment illustrated in FIG. 2E, the value of the converting voltage $V_C$ rapidly approaches the value of a third voltage (e.g. 2V) near the second voltage (e.g. 3V) at T1, and gradually approaches the value of the second voltage from the third voltage within the predetermined period.

In the embodiment illustrated in FIG. 1, the voltage-to-voltage generator 12 includes a bipolar junction transistor (BJT) Q1, a capacitor C1, a switching device D1, and resistors R1~R2. The bipolar junction transistor Q1 includes a collector, an emitter and a base, wherein collector current $I_C$ flows through the collector, emitter current $I_E$ flows through the emitter, and base current $I_B$ flows through the base. The capacitor C1, coupled between the input end N1 and the base of the bipolar junction transistor Q1, is configured to sense a variation of the reference voltage and generate the base current $I_B$ accordingly. The resistor R1, coupled between the input end N1 and the collector of the first BJT and configured to generate the converting voltage $V_C$ which is associated with the waveforms of the reference voltage $V_{REF}$ and the collector current $I_C$. The resistor R2, coupled between the emitter of the bipolar junction transistor Q1 and the reference end N3, is configured to adjust the resistance-capacitance (RC) time constant of the emitter current $I_E$. In another embodiment of the present invention, the resistor R2 may be coupled between the base of the bipolar junction transistor Q1 and the capacitor C1 for adjusting the RC time constant of the emitter current $I_E$.

In the embodiment illustrated in FIG. 1, the capacitor C1 is coupled between the input end N1 and the base of the bipolar junction transistor Q1, while the resistor R2 is coupled between the emitter of the bipolar junction transistor Q1 and the reference end N3.

FIG. 2 is a diagram illustrating relevant operational voltages and current of the voltage-to-voltage generator 12 according to embodiments of the present invention. The vertical axes of the waveforms 2A~2E represent the reference voltage $V_{REF}$, the base current $I_B$, the base voltage $V_B$, the emitter voltage $V_E$, and the converting voltage $V_C$, respectively. The horizontal axes of the waveforms 2A~2E represent time. For illustrative purposes, a cycle period of the reference voltage $V_{REF}$ is used to explain the present invention, wherein the period between the time points T1 and T2 is the positive-polarity period of the reference voltage $V_{REF}$ and the period between the time points T2 and T3 is the negative-polarity period of the reference voltage $V_{REF}$. It is to be noted that the values of the voltages and current depicted in FIG. 2 are only exemplary, but do not limit the scope of the present invention.

As depicted in FIG. 2A, the reference voltage $V_{REF}$ is in a stable state and remains at a constant value between T1 and T2 and between T2 and T3. At T1, T2 and T3, the reference voltage $V_{REF}$ is in a transient state, i.e., changing from a minimum value to a maximum value or changing from the maximum value to the minimum value.

As depicted in FIGS. 2B and 2C, when the reference voltage $V_{REF}$ is in the stable state and remains at the minimum value, the switching device D1 may pull the base voltage $V_B$ to a value close to the minimum value of the reference voltage $V_{REF}$. This way, on the rising edge of the reference voltage $V_{REF}$ (at T1 and T3) and on the falling edge of the reference voltage $V_{REF}$ (at T2), the capacitor C1 may detect the variation of the reference voltage $V_{REF}$, thereby generating the corresponding base current $I_B$. The value of the base current $I_B$ may be represented by the following formula (1), wherein $dV_{REF}/dt$ denotes the variation of the reference voltage $V_{REF}$ with time.

$$I_B = C1 * dV_{REF}/dt \quad (1)$$

As depicted in FIG. 2D, the bipolar junction transistor Q1 operating in an active region provides a current gain β, wherein $I_E=(\beta+1)I_B$ and $I_C=\beta I_B$. In other words, when operating in the active region, the bipolar junction transistor Q1 functions as an amplifier of the capacitor C1 in which the reference voltage $V_{REF}$ equivalently sees (β+1) times of the capacitor C1 to $R_E$. The value of the emitter voltage $V_E$ may be represented by the following formula (2), wherein $V_E(t)$ denotes the value of the emitter voltage $V_E$ at a time point t, $V_{E0}$ denotes the initial value of the emitter voltage $V_E$, and $R_E$ denotes the equivalent resistance on the emitter of the bipolar junction transistor Q1.

$$V_E(t) = V_{E0} * \exp(-t/(C1(\beta+1)*R_E)) \quad (2)$$

As depicted in FIG. 2E, since the current gain β of the bipolar junction transistor Q1 is between tens to hundreds, the collector current $I_C$ is almost equal to the emitter current $I_E$ in the active region. The value of the converting voltage $V_C$ (the emitter voltage $V_E$ of the bipolar junction transistor Q1) may be represented by the following formula (3), wherein $V_C(t)$ denotes the value of the converting voltage $V_C$ at a time point t, $V_{REF}(t)$ denotes the value of the reference voltage $V_{REF}$ at a time point t, $R_E$ denotes the equivalent resistance on the emitter of the bipolar junction transistor Q1, and $R_C$ denotes the equivalent resistance on the collector of the bipolar junction transistor Q1.

$$V_C(t) = V_{REF}(t) - V_E(t)/R_E * R_C \quad (3)$$

As depicted in FIGS. 2A and 2E, the voltage-to-voltage generator 12 according to an embodiment of the present invention can convert the reference voltage $V_{REF}$ having a pulse waveform into the converting voltage $V_C$ having a slow ramp waveform. In other words, the absolute value of the rising/falling edge slope on the waveform of the converting voltage $V_C$ is smaller than the absolute value of the rising/falling edge slope on the waveform of the reference voltage $V_{REF}$.

On the other hand, when the reference voltage $V_{REF}$ is in the stable state and remains at the minimum value, the switching device Dl may pull the base voltage $V_B$ to a value close to the minimum value of the reference voltage $V_{REF}$. This way, on the next coming rising/falling edge of the reference voltage $V_{REF}$, the capacitor C1 detects the variation of the reference voltage $V_{REF}$ with time ($dV_{REF}/dt$), thereby generating the corresponding base current $I_B$, wherein $I_B = C1*dV_{REF}/dt$. In an embodiment of the present invention, the switching device may be a diode or another device with similar function. However, the method of implementing the switching device D1 does not limit the scope of the present invention.

In the biasing circuit 100 illustrated in FIG. 1, the voltage-to-current generator 14 may be implemented as a transconductance amplifier, such as a Darlington pair which includes bipolar junction transistors Q3~Q4 and a resistor R5. The base of the bipolar junction transistor Q3 is coupled to the collector of the bipolar junction transistor Q1 in the voltage-to-voltage generator 12 for receiving the converting voltage $V_C$. The base of the bipolar junction transistor Q4 is coupled to the emitter of the bipolar junction transistor Q3, and the collector of the bipolar junction transistor Q4 is coupled to the collector of the bipolar junction transistor Q3. The resistor R5 is coupled between the emitter of the bipolar junction transistor Q4 and the reference end N3. The voltage-to-current generator 14 is configured to convert the converting voltage $V_C$ into first current I1. The value of the first current I1 may be represented by the following formula (4), wherein $V_C(t)$ denotes the value of the converting voltage $V_C$ at a time point t, $V_{BE3}$ denotes the base-emitter voltage of the bipolar junction transistor Q3, and $V_{BE4}$ denotes the base-emitter voltage of the bipolar junction transistor Q4.

$$I1(t) = (V_C(t) - V_{BE3} - V_{BE4})/R5 \quad (4)$$

In the biasing circuit 100 illustrated in FIG. 1, the differential current generator 16 includes a resistor R6 for sensing the reference voltage $V_{REF}$ so as to generate corresponding second current I2, thereby generating the operational current $I_{OUT}$ according to the difference between the first current I1 and the second current I2. The values of the second current I2 and the operational current $I_{OUT}$ may be represented by the following formulae (5) and (6), respectively, wherein $I_{OUT}(t)$ denotes the value of the operational current $I_{OUT}$ at a time point t, $I1(t)$ denotes the value of the first current I1 at a time point t, $I2(t)$ denotes the value of the second current I2 at a time point t, $V_{BE5}$ denotes the base-emitter voltage of the bipolar junction transistor Q5, and $V_{BE6}$ denotes the base-emitter voltage of the bipolar junction transistor Q6.

$$I2(t) = (V_{REF}(t) - V_{BE5} - V_{BE6})/R6 \quad (5)$$

$$I_{OUT}(t) = I2(t) - I1(t) \quad (6)$$

Figure 3:
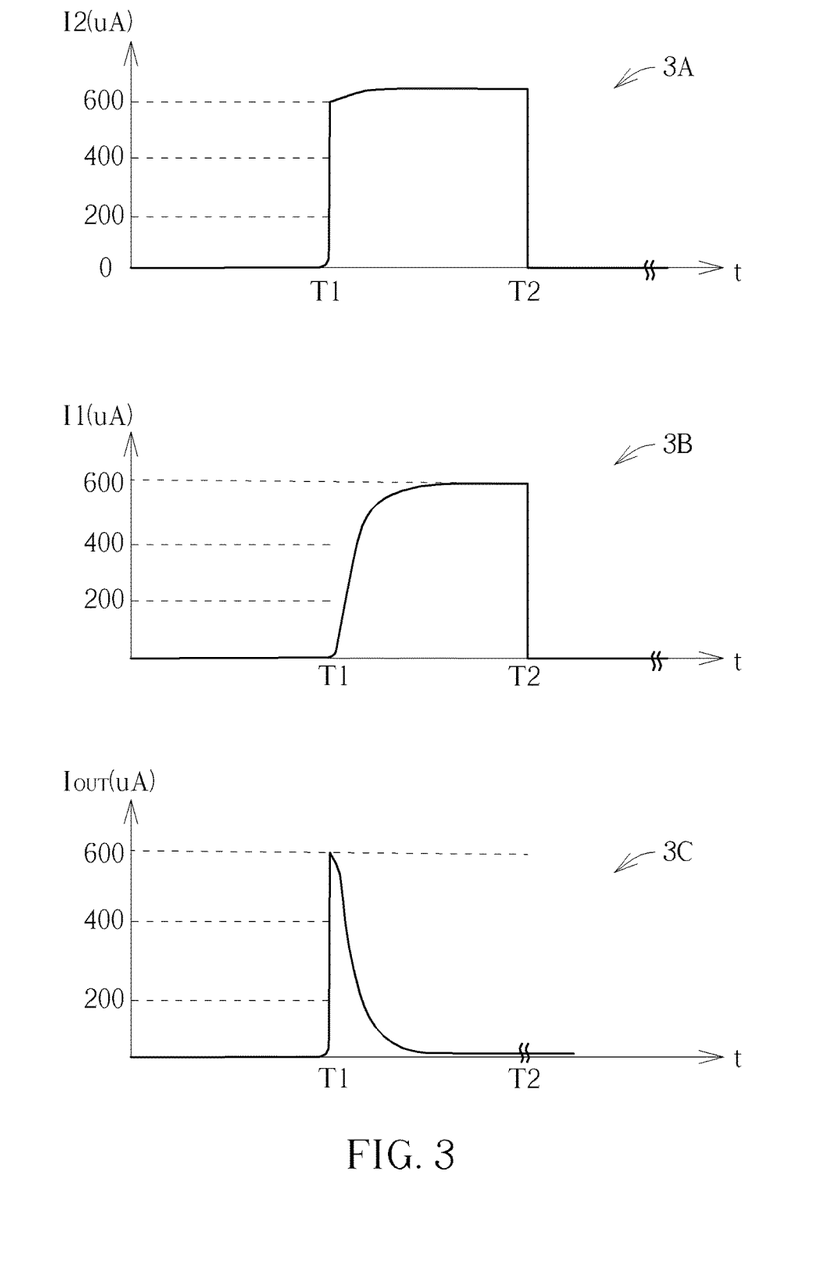
FIG. 3 is a diagram illustrating relevant operational voltages and current of a voltage-to-current generator and a differential current generator according to embodiments of the present invention.

FIG. 3 is a diagram illustrating relevant operational voltages and current of the voltage-to-current generator 14 and the differential current generator 16 according to embodiments of the present invention. The vertical axes of the waveforms 3A~3C represent the second current I2, the first current I1, and the operational current $I_{OUT}$, respectively. The horizontal axes of the waveforms 3A~3C represent time. For illustrative purposes, a cycle period of the reference voltage $V_{REF}$ is used to explain the present invention, wherein the period between the time points T1 and T2 is the positive-polarity period of the reference voltage $V_{REF}$. It is to be noted that the values of the voltages and current depicted in FIG. 3 are only exemplary, but do not limit the scope of the present invention.

As previously stated, the reference voltage $V_{REF}$ is a pulse square wave, and the value of the second current I2 is related to the value of the reference voltage $V_{REF}$. Therefore, the waveform of the second current I2 is similar to a pulse square wave, as depicted by the waveform 3A.

The converting voltage $V_C$ generated by the voltage-to-voltage generator 12 has a slow ramp waveform, and the value of the first current I1 is related to the value of the converting voltage $V_C$. Therefore, the first current I1 also has a slow ramp waveform, as depicted by the waveform 3B.

Since the value of the operational current $I_{OUT}$ is related to the difference between the first current I1 and the second current I2, the operational current $I_{OUT}$ includes surge waves on the rising/falling edges of the reference voltage $V_{REF}$, as depicted by the waveform 3C.

In the biasing circuit 100 illustrated in FIG. 1, the converting circuit 120 may include bipolar junction transistors Q5~Q7 and a resistor R7. The base and the collector of the bipolar junction transistor Q5 and the base of the bipolar junction transistor Q7 are coupled to the differential current generator 16 for receiving the operational current $I_{OUT}$. The base and the collector of the bipolar junction transistor Q6 are coupled to the emitter of the bipolar junction transistor Q5, and the emitter of the bipolar junction transistor Q6 is coupled to the reference end N3. The converting circuit 120 is configured to convert the operational current $I_{OUT}$ into an operational signal $S_{OUT}$, wherein the operational signal $S_{OUT}$ can be a voltage signal or a current signal. The bipolar junction transistor Q7 functions as an emitter follower buffer whose emitter current supplies large base current to the BJTs (not shown) in the power amplifier. If the base of the bipolar junction transistor Q7 is biased by a constant voltage, the bipolar junction transistor Q7 and the BJTs in the power amplifier may generate too much output current when temperature increasing. However, the bipolar junction transistors Q5 and Q6 can provide temperature compensation since their voltage difference decreases with temperature, thereby decreasing the output current of the BJTs in the power amplifier when temperature increasing.

Figure 4:
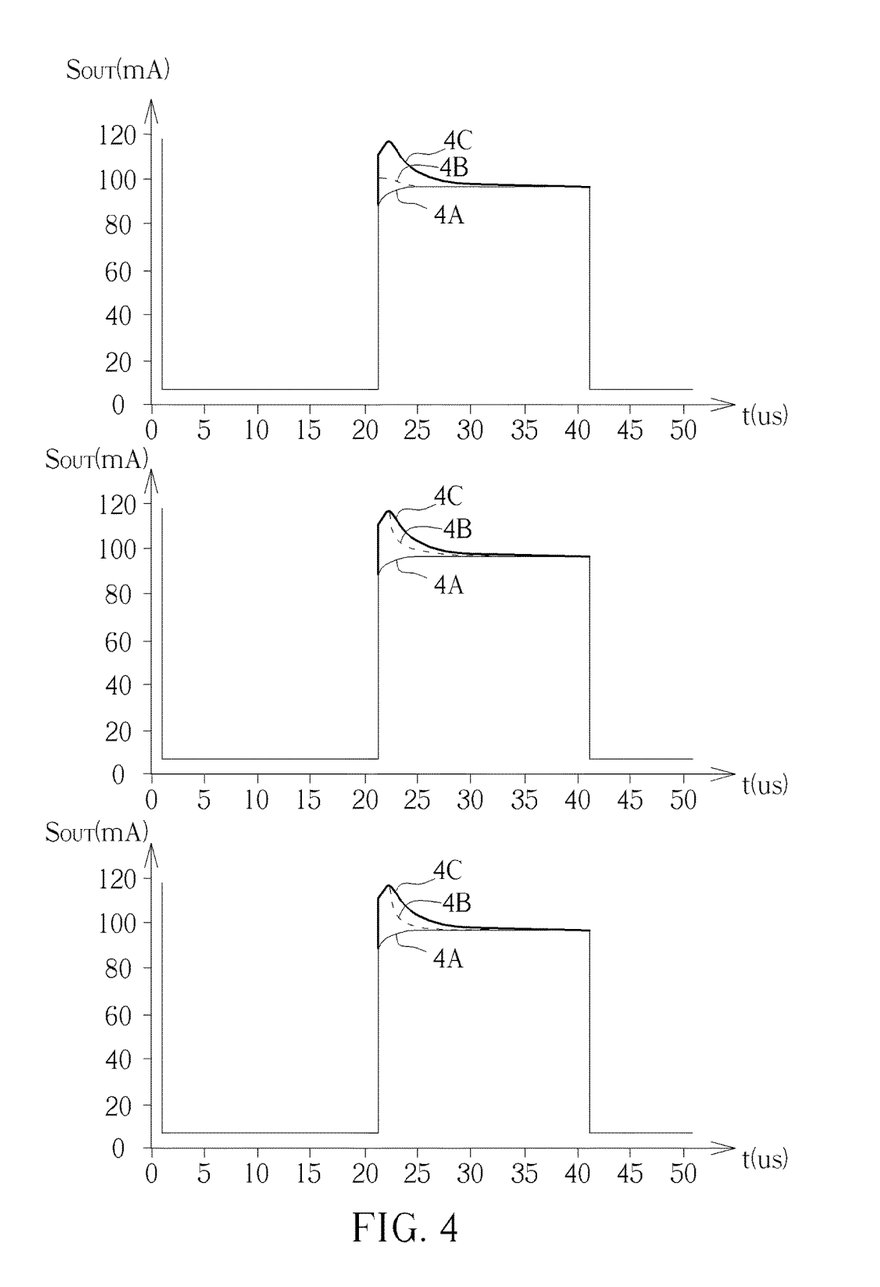
FIG. 4 is a diagram illustrating the operational signal generated by the boost circuit according to embodiments of the present invention.

FIG. 4 is a diagram illustrating the operational signal $S_{OUT}$ generated by the biasing circuit 100 according to embodiments of the present invention. The waveform 4A represents the waveform of the operational signal $S_{OUT}$ when the biasing circuit does not include the boost circuit 110 (i.e. prior art biasing circuit). The waveforms 4B-4C represent the waveforms of the operational signal $S_{OUT}$ with different settings of the boost circuit 110. For illustrative purpose, FIG. 4 depicts the embodiment when the operational signal $S_{OUT}$ is a current signal. The values of the current depicted in FIG. 4 are only exemplary, but do not limit the scope of the present invention.

As depicted by the waveform 4A, the operational signal $S_{OUT}$ generated by the prior art biasing circuit is a pulse square wave which resembles the reference voltage $V_{REF}$, and does not shorten the transient response of the power amplifier.

As depicted by the waveforms 4B-4C, the operational signal $S_{OUT}$ generated by the present biasing circuit includes surge waves on the rising/falling edges. Therefore, the present biasing circuit can provide a larger operational signal $S_{OUT}$ at initial activation, thereby shortening the transient response of the power amplifier.

Also, an embodiment of the present invention can adjust the surge height of the operational signal $S_{OUT}$ by varying the setting of the boost circuit 110. In the embodiment illustrated on the top of FIG. 4, the value of the resistor R1 in the voltage-to-voltage generator 12 may be adjusted, wherein the waveform 4C is the result of a larger value of the resistor R1 and the waveform. 4B is the result of a smaller value of the resistor R1. In the embodiment illustrated in the middle of FIG. 4, the value of the resistor R2 in the voltage-to-voltage generator 12 may be adjusted, wherein the waveform 4C is the result of a larger value of the resistor R2 and the waveform 4B is the result of a smaller value of the resistor R2. In the embodiment illustrated on the bottom of FIG. 4, the value of the capacitor C1 in the voltage-to-voltage generator 12 may be adjusted, wherein the waveform 4C is the result of a larger value of the capacitor C1 and the waveform 4B is the result of a smaller value of the capacitor C1. In another embodiment, the value of any combination of the resistor R1, the resistor R2, and the capacitor C1 can be varied for adjusting the surge height of the operational signal $S_{OUT}$.

Figure 5:
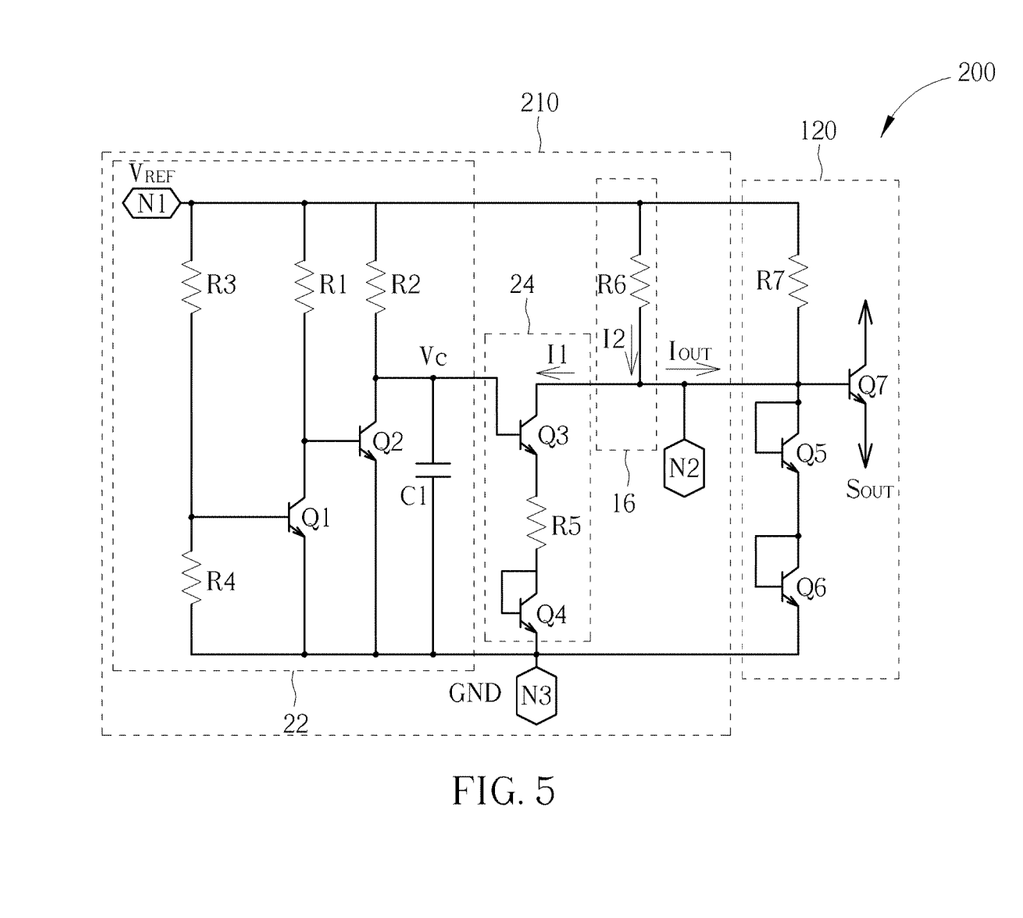
FIG. 5 is a diagram illustrating a biasing circuit for use in a power amplifier according to another embodiment of the present invention.

FIG. 5 is a diagram illustrating a biasing circuit 200 for use in a power amplifier according to another embodiment of the present invention. The biasing circuit 200 includes a boost circuit 210 and a converting circuit 120. The boost circuit 210 includes an input end N1, an output end N2, a reference end N3, a voltage-to-voltage generator 22, a voltage-to-current generator 24, and a differential current generator 16. The input end N1 is coupled to a reference voltage $V_{REF}$. The output end N2 is arranged to output operational current $I_{OUT}$. The reference end N3 is coupled to a reference level GND.

In the embodiment illustrated in FIG. 5, the voltage-to-voltage generator 22 includes bipolar junction transistors Q1~Q2, a capacitor C1, and resistors R1~R4. The resistors R3 and R4 form a voltage-dividing circuit which supplies the base voltage ($V_{REF}$*R4/(R3+R4)) to the bipolar junction transistor Q1 so that the bipolar junction transistor Q1 does not enter a reverse saturation region. The resistor R1 is a current-limiting resistor. After inputting the reference voltage $V_{REF}$, the bipolar junction transistor Q1 is turned on, thereby pulling the collector of the bipolar junction transistor Q1 to ground level. In other words, the bipolar junction transistor Q1 and the resistors R1, R3 and R4 function as an inverter.

On the other hand, the base of the bipolar junction transistor Q2 in the voltage-to-voltage generator 22 is coupled to the collector of the bipolar junction transistor Q1. When the collector of the bipolar junction transistor Q1 is at ground level, the bipolar junction transistor Q2 is turned off, thereby allowing the reference voltage $V_{REF}$ to charge the capacitor C1 via the resistor R2. The waveform of the converting voltage $V_C$ generated by the voltage-to-voltage generator 22 may also be represented by the waveform 2E in FIG. 2.

In the embodiment illustrated in FIG. 5, the voltage-to-current generator 24 may be implemented as a high-impedance transconductance amplifier, such as including bipolar junction transistors Q3~Q4 and a resistor R5. The base of the bipolar junction transistor Q3 is coupled to the collector of the bipolar junction transistor Q2 in the voltage-to-voltage generator 22 for receiving to converting voltage $V_C$. The base of the bipolar junction transistor Q4 is coupled to the collector of the bipolar junction transistor Q4, and the emitter of the bipolar junction transistor Q4 is coupled to the reference end N3. The resistor R5 is coupled between the emitter of the bipolar junction transistor Q3 and the collector of the bipolar junction transistor Q4. The voltage-to-current generator 24 is configured to convert the converting voltage $V_C$ into first current I1. The value of the first current I1 may be represented by the following formula (7), wherein $V_C$(t) denotes the value of the converting voltage $V_C$ at a time point t, $V_{BE3}$ denotes the base-emitter voltage of the bipolar junction transistor Q3, and $V_{BE4}$ denotes the base-emitter voltage of the bipolar junction transistor Q4.

$$I1(t)=(V_C(t)-V_{BE3}-V_{BE4})/R5 \quad (7)$$

In the biasing circuit 200 illustrated in FIG. 5, the differential current generator 16 and the converting circuit 120 function in the same way as those in the biasing circuit 100 illustrated in FIG. 1. Therefore, the operational signal $S_{OUT}$ of the boost circuit 210 with different settings may also be illustrated in FIG. 4.

Figure 6:
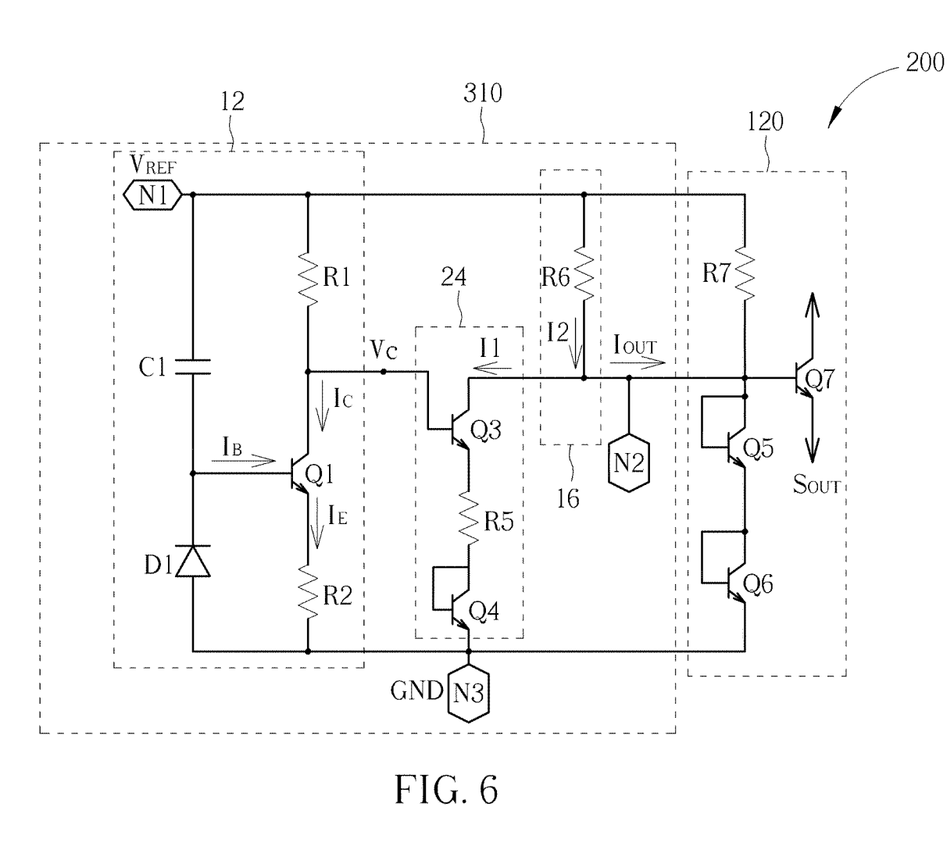
FIG. 6 is a diagram illustrating a biasing circuit for use in a power amplifier according to another embodiment of the present invention.

FIG. 6 is a diagram illustrating a biasing circuit 300 for use in a power amplifier according to another embodiment of the present invention. The biasing circuit 300 includes a boost circuit 310 and a converting circuit 120. The boost circuit 310 includes an input end N1, an output end N2, a reference end N3, a voltage-to-voltage generator 12, a voltage-to-current generator 24, and a differential current generator 16. The input end N1 is coupled to a reference voltage $V_{REF}$. The output end N2 is arranged to output operational current $I_{OUT}$. The reference end N3 is coupled to a reference level GND.

In the biasing circuit 300 illustrated in FIG. 6, the voltage-to-voltage generator 12 functions in the same way as that in the biasing circuit 100 illustrated in FIG. 1, the voltage-to-current generator 24 functions in the same way as that in the biasing circuit 200 illustrated in FIG. 5, and the differential current generator 16 and the converting circuit 120 function in the same way as those in the biasing circuit 100 illustrated in FIG. 1.

Figure 7:
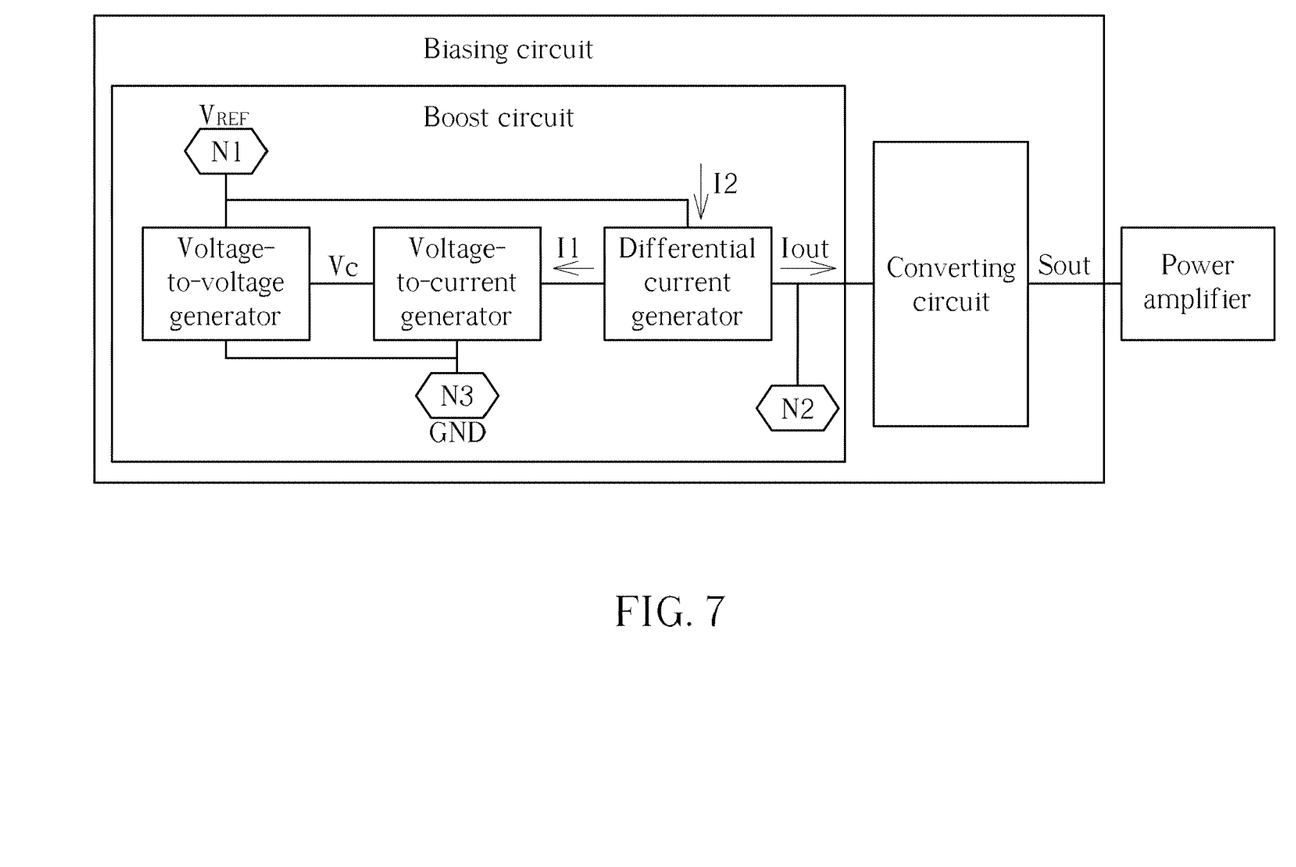
FIG. 7 is a functional block diagram illustrating the operation of a biasing circuit when adopted in a power amplifier according to an embodiment of the present invention.

FIG. 7 is a functional block diagram illustrating the operation of a biasing circuit when adopted in a power amplifier according to an embodiment of the present invention. Since the present biasing circuit includes a boost circuit, the operational signal $S_{OUT}$ includes surge waves on the rising/falling edges. Therefore, the present biasing circuit can provide a larger operational signal $S_{OUT}$ at initial activation, thereby shortening the transient response of the power amplifier.

In summary, the boost circuit is capable of shortening transient response for use in a power amplifier according to an embodiment of the present invention. Besides, the boost circuit is capable of minimizing or avoiding the use of current mirrors according to another embodiment of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A boost circuit for use in a power amplifier comprising:
   an input end arranged to output a reference voltage;
   a first output end arranged to output an operational current;

a reference end arranged to couple to a reference level;
a voltage-to-voltage generator coupled to the input end and configured to generate a converting voltage according to the reference voltage, wherein an absolute value of a rising edge slope on a waveform of the converting voltage is smaller than an absolute value of a rising edge slope on a waveform of the reference voltage or an absolute value of a falling edge slope on the waveform of the converting voltage is smaller than an absolute value of a falling edge slope on the waveform of the reference voltage;
a voltage-to-current generator coupled to the voltage-to-voltage generator and configured to convert the converting voltage into a first current, wherein a waveform of the first current corresponds to a waveform of the converting voltage; and
a differential current generator coupled between the input end and the voltage-to-current generator and configured to generate a second current associated the waveform the reference voltage and output the operational current, wherein the operational current is associated with the first current and the second current.

2. The boost circuit of claim 1 wherein the voltage-to-voltage generator comprises:
a first bipolar junction transistor (BJT) having a collector, an emitter and a base, wherein a collector current flows through the collector, an emitter current flows through the emitter and a base current flows through the base;
a first capacitor configured to sense a variation of the reference voltage and generate the base current accordingly;
a first resistor coupled between the input end and the collector of the first BJT and configured to generate the converting voltage associated with the waveform of the reference voltage and the waveform of the collector current; and
a second resistor configured to adjust a time constant of the emitter current.

3. The boost circuit of claim 2, wherein the second resistor is coupled between the reference end and the emitter of the first BJT or coupled between the first capacitor end and the base of the first BJT.

4. The boost circuit of claim 2 further comprising a switching device having:
a first end coupled to the first capacitor and the base of the first BJT; and
a second end coupled to the reference end.

5. The boost circuit of claim 4, wherein the switching device comprises a diode having:
a cathode coupled to the first capacitor and the base of the first BJT; and
an anode coupled to the reference end.

6. The boost circuit of claim 2, wherein the voltage-to-current generator comprises:
a second BJT including:
a base coupled between the first resistor and the collector of the first BJT;
an emitter; and
a collector;
a third BJT including:
a base coupled to the emitter of the second BJT;
an emitter; and
a collector coupled to the collector of the second BJT; and
a third resistor coupled between the reference end and the emitter of the first BJT.

7. The boost circuit of claim 2, wherein the voltage-to-current generator comprises:
a second BJT including:
a base coupled between the first resistor and the collector of the first BJT;
an emitter; and
a collector;
a third BJT including:
a base;
an emitter coupled to the reference end; and
a collector coupled to the base of the third BJT; and
a third resistor coupled between the emitter of the second BJT and the collector of the third BJT.

8. The boost circuit of claim 1, wherein the voltage-to-voltage generator comprises:
a first resistor;
a second resistor;
a third resistor;
a fourth resistor;
a first BJT including:
a base coupled between the third resistor and the fourth resistor;
an emitter coupled to the reference end; and
a collector coupled to the input end via the first resistor;
a second BJT including:
a base coupled between the first resistor and the collector of the first BJT;
an emitter coupled to the reference end; and
a collector coupled to the input end via the second resistor; and
a first capacitor coupled between the collector of the second BJT and the reference end.

9. The boost circuit of claim 8, wherein the voltage-to-current generator comprises:
a third BJT including:
a base coupled between the second resistor and the collector of the first BJT;
an emitter; and
a collector;
a fourth BJT including:
a base coupled to the emitter of the third BJT;
an emitter; and
a collector coupled to the collector of the third BJT; and
a fifth resistor coupled between the emitter of the fourth BJT and the reference end.

10. The boost circuit of claim 8, wherein the voltage-to-current generator comprises:
a third BJT including:
a base coupled between the second resistor and the collector of the second BJT;
an emitter; and
a collector;
a fourth BJT including:
a base;
an emitter coupled to the reference end; and
a collector coupled to the base of the fourth BJT; and
a fifth resistor coupled between the emitter of the third BJT and the collector of the fourth BJT.

11. The boost circuit of claim 1, wherein the differential current generator includes a resistor which includes:
a first end coupled to the input end; and
a second end coupled between the voltage-to-current generator and the first output end.

12. The boost circuit of claim 1, wherein:
the reference voltage changes from a first voltage to a second voltage during a period and remains at the second voltage for a predetermined period of time; and a value of the converting voltage gradually approaches a value of the second voltage during the predetermined period of time.

13. The boost circuit of claim 12, wherein the voltage-to-voltage generator comprises a slow-ramp generator which gradually increases or decreases the rising edge slope or the falling edge slope on the waveform of the converting voltage.

14. The boost circuit of claim 1, wherein the first output end is coupled to a converting circuit which is configured to generate an operational signal on a second output end according to the operational current.

15. The boost circuit of claim 14, wherein the converting circuit comprises:
 a fifth BJT including:
  a base;
  an emitter; and
  a collector coupled to the base of the fifth BJT;
 a sixth BJT including:
  a base coupled to the emitter of the fifth BJT;
  an emitter coupled to the reference end; and
  a collector coupled to the base of the sixth BJT;
 a seventh BJT including:
  a bas coupled to the collector of the fifth BJT;
  an emitter coupled to the second output end; and
  a collector; and
 a sixth resistor coupled between the input end and the collector of the fifth BJT.

16. The boost circuit of claim 1, wherein the voltage-to-voltage generator includes a transconductance amplifier.

17. The boost circuit of claim 1, wherein a value of the operational current is equal to a difference between the second current and the first current.

18. The boost circuit of claim 1, wherein the reference level is a ground level.

19. A boost circuit for use in a power amplifier comprising:
 an input end arranged to output a reference voltage, wherein the reference voltage changes from a first voltage to a second voltage during a period and remains at the second voltage for a predetermined period of time;
 a first output end arranged to output an operational current;
 a reference end arranged to couple to a reference level;
 a voltage-to-voltage generator coupled to the input end and configured to generate a converting voltage according to the reference voltage, wherein a value of the converting voltage gradually approaches a value of the second voltage during the predetermined period of time;
 a voltage-to-current generator coupled to the voltage-to-voltage generator and configured to convert the converting voltage into a first current, wherein a waveform of the first current corresponds to a waveform of the converting voltage; and
 a differential current generator coupled between the input end and the voltage-to-current generator and configured to generate a second current associated the waveform the reference voltage and output the operational current, wherein the operational current is associated with the first current and the second current.

20. The boost circuit of claim 19, wherein the voltage-to-voltage generator comprises a slow-ramp generator which gradually increases or decreases the rising edge slope or the falling edge slope on the waveform of the converting voltage.

* * * * *